US007263645B2

(12) United States Patent
Mitsutani (10) Patent No.: US 7,263,645 B2
(45) Date of Patent: Aug. 28, 2007

(54) COMMUNICATION SYSTEM USING CORRELATION MATRIX, CORRELATION MATRIX LEARNING METHOD, CORRELATION MATRIX LEARNING DEVICE AND PROGRAM

(75) Inventor: Naoki Mitsutani, Tokyo (JP)

(73) Assignee: NEC Corporation, Tokyo (JP)

( * ) Notice: Subject to any disclaimer, the term of this patent is extended or adjusted under 35 U.S.C. 154(b) by 459 days.

(21) Appl. No.: 10/876,019

(22) Filed: Jun. 25, 2004

(65) Prior Publication Data

US 2005/0005221 A1 Jan. 6, 2005

(30) Foreign Application Priority Data

Jun. 27, 2003 (JP) ............................. 2003-184041

(51) Int. Cl.
*H03M 13/03* (2006.01)
(52) U.S. Cl. ..................................... 714/752
(58) Field of Classification Search .............. 706/12; 714/752
See application file for complete search history.

(56) References Cited

U.S. PATENT DOCUMENTS

| 5,063,533 | A  | * | 11/1991 | Erhart et al. ............... 711/157 |
| 7,024,612 | B2 | * | 4/2006  | Mitsutani ................... 714/752 |
| 2001/0039637 | A1 | * | 11/2001 | Bengough .................. 714/752 |
| 2002/0174078 | A1 | * | 11/2002 | Mitsutani ................... 706/12 |

FOREIGN PATENT DOCUMENTS

EP 1 193 883 A2 4/2002
EP 1 251 434 A2 10/2002
JP 2002-111515 A 4/2002
JP 2002-314434 A 10/2002

OTHER PUBLICATIONS

G.C. Clark et al., "Error Correction Coding for Digital Communications" Passage, 1981, New York.
Shu Lin, D. J. Costello, "Error Control Coding-Fundamentals and Applications", Englewood Cliffs, Prentice Hall, US, 1983, pp. 271-272.

* cited by examiner

*Primary Examiner*—Guy Lamarre
*Assistant Examiner*—Sam Rizk
(74) *Attorney, Agent, or Firm*—Sughrue Mion, PLLC (57) ABSTRACT

A communication system of the present invention comprises a transmission side for transmitting a codeword in which the components of a block encoded codeword are rearranged with a predetermined rule of rearrangement to disperse a redundant portion, and a receiving side for decoding into an original codeword by performing a calculation with a correlation matrix having the row components rearranged with the same rule. This correlation matrix is learned by performing a predetermined calculation using a post-coded codeword and a pre-learned correlation matrix, comparing the components of the calculation result with a preset threshold, and updating the elements of the correlation matrix based on the comparison results to obtain the post-learned correlation matrix. Threshold for learning the correlation matrix is gradually increased as the learning operation proceeds, whereby the optimal threshold to keep the enough margin for bit error is obtained for all of the codewords. Thereby, in transmitting or receiving the block encoded codeword on a radio transmission path, it is possible to reduce the probability that the error correction ability is degraded when a burst bit error (burst error) occurs.

15 Claims, 5 Drawing Sheets

COMMUNICATION SYSTEM USING CORRELATION MATRIX, CORRELATION MATRIX LEARNING METHOD, CORRELATION MATRIX LEARNING DEVICE AND PROGRAM

BACKGROUND OF THE INVENTION

1. Field of the Invention

The present invention relates to a communication system using an error correction code, and more particularly to a communication system for transmitting or receiving a block encoded codeword, and decoding into an original codeword using a correlation matrix generated through learning, a correlation matrix learning method, a correlation matrix learning device and its program.

2. Description of the Related Art

In a communication system using an error correction code, a decoding method is conventionally employed in which the transmitting side transmits a block encoded codeword at a predetermined encoding rate, and the receiving side decodes it into an original codeword, using a correlation matrix. This correlation matrix represents correlation between an original pre-coded codeword and a coded codeword, which is determined by learning.

According to a conventional method for learning and obtaining a correlation matrix, first of all a coded codeword and a pre-learned correlation matrix are used to perform a predetermined calculation, thereby obtaining a result containing multiple components. Then, each of the components contained in the calculation result is compared with a preset threshold "±TH". Based on the comparison, elements of the pre-learned correlation matrix are updated to obtain a post-learned correlation matrix.

Specifically, assuming that the original pre-coded codeword has M bits and the coded codeword has N bits, the correlation matrix has N rows and M columns. When this correlation matrix is multiplied by the coded codeword, the result will contain M number of components corresponding one-to-one to respective bits of the original pre-coded codeword.

A threshold TH is set for each of the components of the original pre-coded codeword in the following way. That is, when a component of the original pre-coded codeword is "+1", then the threshold is set to "+TH" (TH>0). When a component of the original pre-coded codeword is "0", then the threshold is set to "−TH". Each of the components resulting from the calculation is compared with the corresponding threshold "+TH" or "−TH". When the components resulting from the calculation are to be compared to threshold "+TH", the components in the corresponding column of the correlation matrix are updated (addition of "±$\Delta W_k$" ($\Delta W_k$>0)) only when their values are lower than "+TH". On the other hand, when the components resulting from the calculation are to be compared to threshold "−TH", the components in the corresponding column of the correlation matrix are updated only when their values are higher than "−TH". Herein, the sign "±" of the update value for each row depends on the sign "±" of the corresponding bit of the coded codeword.

Thereafter, the learning operation of the correlation matrix is repeated for all of the codewords until update can be no longer performed for the elements of the correlation matrix for all of the codewords. Consequently, if the absolute value of calculation results are greater than or equal to the absolute value of threshold for all of the codewords, the learning operation of the correlation matrix is converged, and correlation matrix is obtained, which can be used for decoding.

When the elements of the correlation matrix have no difference in the calculation results of coding before and after learning operation of the correlation matrix for all of the codewords, the update value is changed from "±$\Delta W_k$" to "±$\Delta W_{k+1}$" ($\Delta W_k$>$\Delta W_{k+1}$>0). In this way, the update value of the correlation matrix is changed gradually until the learning operation is converged.

Moreover, for all of the codewords, the threshold for learning the correlation matrix is changed gradually such as "$TH_0$, $TH_1$, $TH_2$, $TH_3$, . . . , $TH_n$, $TH_{n+1}$, . . . " ($TH_0$<$TH_1$<$TH_2$<$TH_3$<. . . , $TH_n$<$TH_{n+1}$ . . . ) as the learning operation proceeds. Thereby, the correlation matrix is learned while gradually changing a threshold for learning the correlation matrix to search optimal thresholds for all of the multiple codewords, thereby rapidly obtaining an optimal correlation matrix for all of the codewords (e.g., refer to Japanese Patent Laid-Open No. 2002-111515 and No. 2002-314434).

However, the conventional technique had a problem that because a redundant portion for keeping the distance between codewords is collectively added after the original codeword in performing block encoding, the error correction ability is degraded when a burst bit error (burst error) occurs in the redundant portion in transmitting or receiving data on a radio transmission path.

SUMMARY OF THE INVENTION

The present invention has an objective of reducing the influence of a burst bit error (burst error) which may occur on a radio transmission path to degrade the error correction ability, when block encoded codeword is communicated using the transmission path.

In order to achieve the above objective, a communication system of the invention comprises a transmitting apparatus having an encoder, a rearrangement circuit and a sending unit, and a receiving apparatus having a receiving unit and an arithmetic unit.

The encoder of the transmitting apparatus performs block encoding on an input original codeword at a predetermined encoding rate to generate a codeword with a redundant portion added. The rearrangement circuit rearranges the components of the codeword so that the redundant portion of the codeword generated by the encoder may be dispersed over multiple parts of the codeword. Also, the sending unit sends the codeword after rearrangement in the rearrangement circuit to the corresponding receiving apparatus.

The receiving unit of the receiving apparatus receives the codeword after rearrangement transmitted from the sending unit. The arithmetic unit performs a calculation using the codeword after rearrangement received by the receiving unit and a correlation matrix for which the rows are rearranged according to the same rule of rearrangement as that of the rearrangement circuit to decode the original codeword from the received codeword. In this way, the probability that the burst error concentrates on the redundant portion is reduced by dispersing the redundant portion.

To generate a correlation matrix for use in the communication system, a correlation matrix learning method of the invention comprises dispersing a redundant portion added to the codeword of learning object over multiple parts of the codeword, and for each-codeword, performing a predetermined calculation with the codeword and the correlation matrix. And the method comprises updating the correlation matrix based on the comparison results of the threshold corresponding to the original codeword with the calculation results, whereby the optimal correlation matrix to decode the original codeword from the codeword is generated.

Specifically, a correlation matrix learning method of the invention comprises rearranging the components of a codeword of learning object so that the redundant portion added to the codeword may be dispersed over multiple parts of the codeword, and performing a calculation with the codeword and the correlation matrix. And the method comprises, for each calculation result, comparing the components of the calculation result with the threshold for the components corresponding to the original codeword of the codeword of calculation object, and updating the values of the corresponding components of the correlation matrix by an update value, when the comparison results indicate the components to need the update. Repeating such learning processes produces an optimum correlation matrix.

Also, to practice the correlation matrix learning method, a correlation matrix learning device of the invention comprises a rearrangement circuit for rearranging the components of the codeword of learning object so that the redundant portion added to the codeword may be dispersed over multiple parts of the codeword. After the components of the codeword are rearranged by the rearrangement circuit, the device, for each codeword, performs a predetermined calculation using the codeword and the correlation matrix, and for each calculation result, compares the components of the calculation result with the threshold for the components corresponding to the original codeword of the codeword of calculation object. The correlation matrix is updated based on the comparison results to generate the optimal correlation matrix to decode the original codeword from the codeword.

Specifically, the correlation matrix learning device of the invention a rearrangement circuit, an arithmetic unit, a comparison unit and a learning state monitoring unit. The rearrangement circuit rearranges the components of the codeword of learning object so that the redundant portion added to the codeword may be dispersed over multiple parts of the codeword, when the codeword is input. The arithmetic unit performs a predetermined calculation using the codeword having the components rearranged by the rearrangement circuit and the correlation matrix. The comparison unit compares the components of the calculation result by the arithmetic unit with the threshold for the components corresponding to the original codeword of the codeword of calculation object. And a learning state monitor updates the values of the respective components of the correlation matrix by an update value, when the comparison results of the comparison unit indicate the components to need the update. Thereafter, if all of the codewords of learning object have been already input into the rearrangement circuit, a first codeword of learning object is input again into the rearrangement circuit, or if there is any uninput codeword, the next codeword of learning object is input into the rearrangement circuit. By repeating this learning process, the optimal correlation matrix is generated.

Also, a program for the correlation matrix learning method according to the invention is executed on the computer, comprising a rearrangement step, an arithmetic step, a comparison step and a learning state monitoring step. The rearrangement step comprises rearranging the components of the codeword of learning object so that the redundant portion added to the codeword may be dispersed over multiple parts of the codeword, when the codeword is input. The arithmetic step comprises performing a calculation using the codeword having the components rearranged at the rearrangement step and the correlation matrix. The comparison step comprises comparing the components of the calculation result at the arithmetic step with the threshold for the components corresponding to the original codeword of the codeword of calculation object. The learning state monitoring step comprises updating the values of the respective components of the correlation matrix by an update value, when the comparison results at the comparison step indicate the components to need the update. Thereafter, it further comprises inputting a first codeword of learning object again at the rearrangement step if all of the codewords of learning object have been already input at the rearrangement step, or inputting the next codeword of learning object at the rearrangement step, if there is any uninput codeword. By repeating the steps of the learning process, the optimal correlation matrix is generated.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Figure 1:
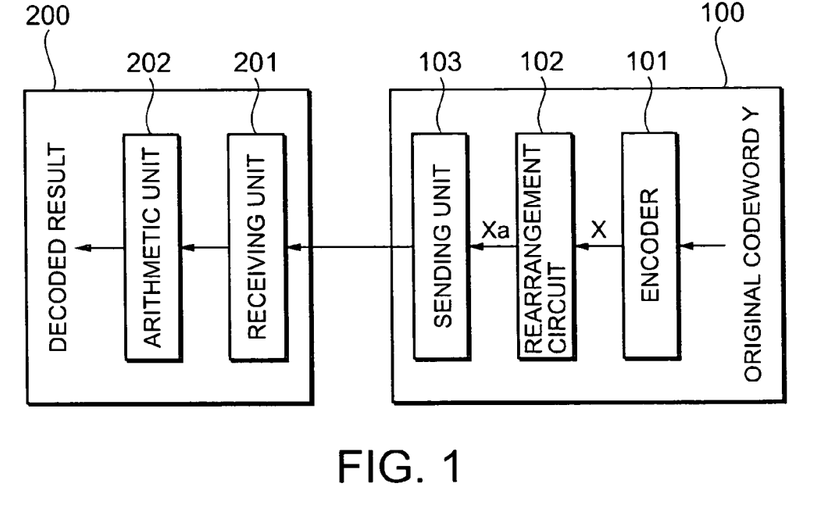
FIG. 1 is a block diagram showing a one-way configuration of a communication system according to an embodiment of the present invention.

The preferred embodiments of the present invention will be described below with reference to the accompanying drawings. FIG. 1 is a block diagram showing a one-way configuration of a communication system according to an embodiment of the invention.

Referring to FIG. 1, a transmitting apparatus 100 constituting the communication system of this embodiment comprises an encoder 101, a rearrangement circuit 102 and a sending unit 103, and a receiving apparatus 200 comprises a receiving unit 201 and an arithmetic unit 202.

Figure 2A:
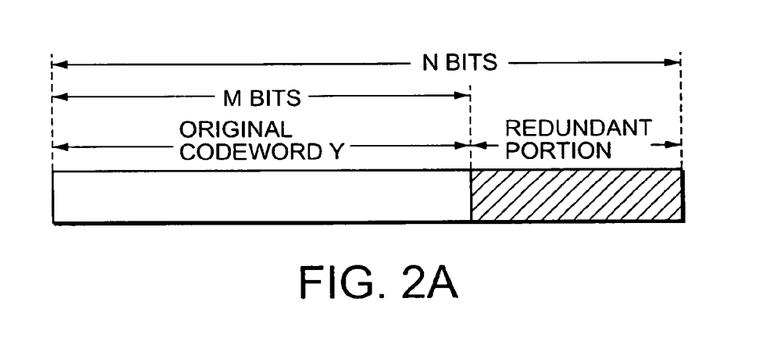
FIGS. 2A and 2B are diagrams showing an N-bit codeword before and after rearrangement.
Figure 2B:
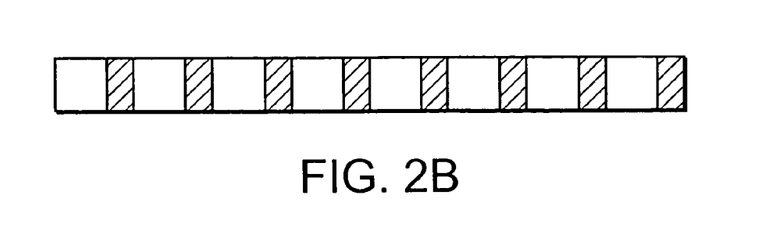

The operation of this embodiment will be described below. FIGS. 2A and 2B are diagrams showing an N-bit codeword before and after rearrangement.

The encoder 101 of the transmitting apparatus 100 inputs an original M-bit codeword Y, and outputs an N-bit codeword X which is block encoded at an encoding rate (N, M).

Such codeword X has a redundant portion of (N-M) bits added after the original codeword Y, as shown in FIG. 2A.

The rearrangement circuit 102 outputs a codeword Xa by rearranging the components of the codeword X so that the redundant portion of the codeword X output from the encoder 101 may be dispersed over multiple parts of the codeword.

This redundant portion may be evenly dispersed over multiple parts of the codeword according to a predetermined rule of rearrangement, as shown in FIG. 2B.

The sending unit 103 sends the codeword Xa after rearrangement output from the rearrangement circuit 102 to the receiving apparatus 200.

On the other hand, the receiving unit 201 of the receiving apparatus 200 receives the codeword Xa after rearrangement transmitted from the sending unit 103 and outputs it to the arithmetic unit 202.

The arithmetic unit 202 performs a calculation using the codeword Xa after rearrangement received by the receiving unit 201 and the correlation matrix W to decode the original codeword Y. It is supposed that this correlation matrix W has the rows rearranged according to the same rearrangement rule as in the rearrangement circuit 102. That is, the calculation results with the correlation matrix W are identical to the codeword Y before rearrangement.

Figure 3A:
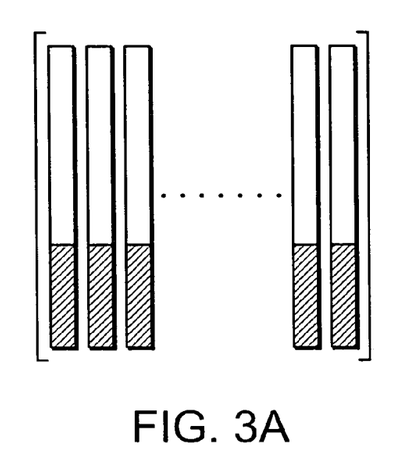
FIGS. 3A and 3B are diagrams showing one example of rearranging row components of a correlation matrix corresponding to FIGS. 2A and 2B.
Figure 3B:
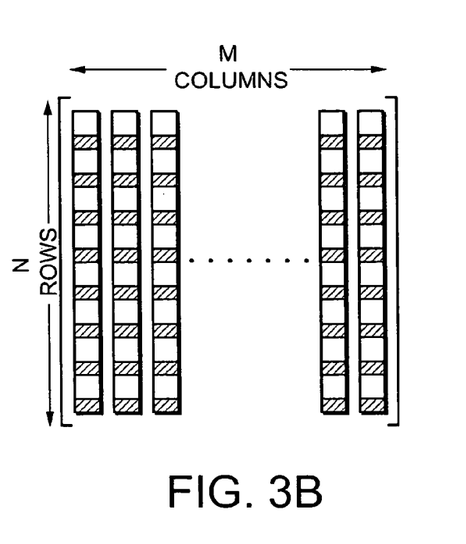

Accordingly, for the codeword Xa rearranged by the rearrangement circuit 102, the calculation results using the correlation matrix W having the row components rearranged according to the same rule as the codeword Xa are identical to the conventional calculation results without rearrangement. That is, since the calculation results of FIG. 2A and FIG. 3A in the conventional example and the calculation results of FIG. 2B and FIG. 3B in this example are identical, it is unnecessary to rearrange the calculation results (decoded results) of M bits again.

In the operation of this embodiment, the components of the block encoded codeword are rearranged so that the redundant portion of the codeword may be dispersed over multiple parts of the codeword, and then transmitted. Therefore, even when a burst error occurs, there is a smaller probability that the error correction ability is lower than with the conventional technique of concentrated arrangement. A communication system for decoding the original codeword using the correlation matrix is implemented by applying the same rearrangement rule on the transmitting side and the receiving side.

The transmitting apparatus 100 and the receiving apparatus 200 can be implemented using a computer. When they are implemented on the computer, the programs for implementing the encoder 101, the rearrangement circuit 102 and the sending unit 103 in the transmitting apparatus 100, and the receiving unit 201 and the arithmetic unit 202 in the receiving apparatus 200 are stored in a disk, a semiconductor memory, or any other recording media. The programs are loaded into the computer. The computer performs the operation in accordance with the loaded program, whereby the encoder 101, the rearrangement circuit 102, and the sending unit 103, and the receiving unit 201 and the arithmetic unit 202 are implemented on the computer.

Figure 4:
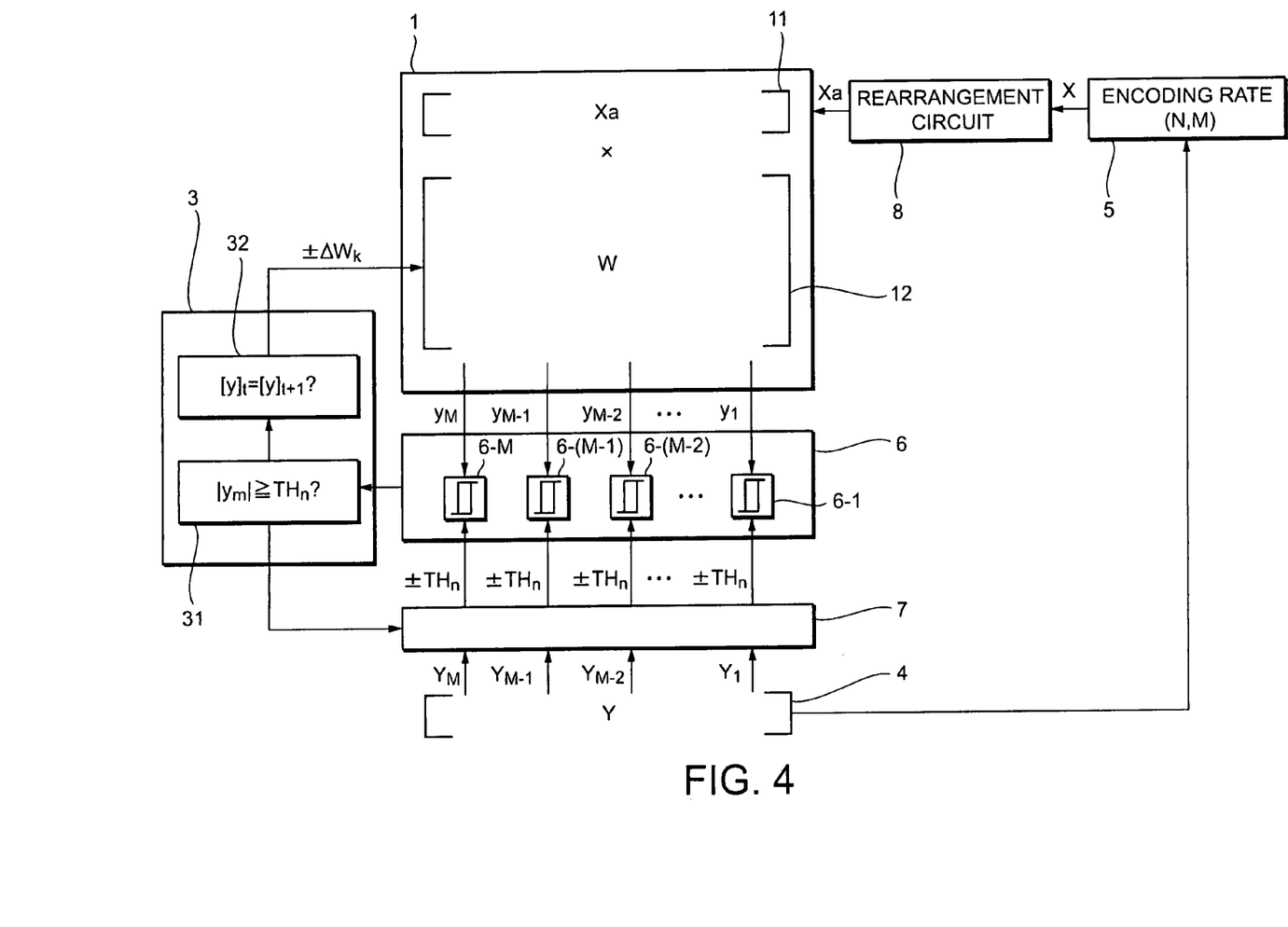
FIG. 4 is a block diagram showing a configuration of a correlation matrix learning device according to an embodiment of the invention.

A learning operation for generating the correlation matrix of this embodiment will be described below. FIG. 4 is a block diagram showing a configuration of a correlation matrix learning device using the correlation matrix learning method according to the invention.

This correlation matrix learning device is provided in the transmitting apparatus 100 or the receiving apparatus 200, to optimize the correlation matrix in the transmitting apparatus 100 or the receiving apparatus 200, as shown in FIG. 1. Also, the same original codeword Y is synchronously held in the transmitting apparatus 100 and the receiving apparatus 200, so that the correlation matrix is optimized in the communication between the transmitting apparatus 100 and the receiving apparatus 200.

The correlation matrix learning device as shown in FIG. 4 comprises an arithmetic unit 1, a learning state monitor 3, an original codeword input unit 4, an encoder 5, a comparison unit 6, a threshold updating unit 7, and a rearrangement circuit 8.

The original codeword input unit 4 inputs an original M-bit codeword Y.

The encoder 5 performs block encoding on the original codeword Y input from the original codeword input unit 4 at an encoding rate (N, M) to obtain an N-bit codeword X. The codeword X has the redundant portion of (N-M) bits added after the original codeword Y.

The rearrangement circuit 8 rearranges the components of the codeword X so that the redundant portion of the codeword X output from the encoder 5 maybe evenly dispersed over multiple parts of the codeword, and outputs the codeword Xa after rearrangement. The rearrangement rule of the rearrangement circuit 8 is identical to that of the rearrangement circuit 102 as shown in FIG. 1.

The arithmetic unit 1 has a codeword input unit 11 and a correlation matrix holding unit 12. The codeword input unit 11 holds the codeword Xa that is rearranged by the rearrangement circuit 8. The correlation matrix holding unit 12 holds the N-row and M-column correlation matrix W. Also, the arithmetic unit 1 multiplies the codeword Xa held in the codeword input unit 11 by the correlation matrix W held in the correlation matrix holding unit 12, and outputs the arithmetic results $y_1$ to $y_M$ for M columns.

The correlation matrix W has the row components rearranged according to the same rule as the codeword Xa in the rearrangement circuit 8, and may be used for the communication system in which the components of the codeword are rearranged before transmission.

The threshold updating unit 7 outputs the threshold corresponding to the original codeword Y input from the original codeword input unit 4, the threshold being changed gradually according to the learning convergence state.

The comparison unit 6 has M number of comparison circuits 6-1 to 6-M. The comparison circuits 6-1 to 6-M compare the calculation results $y_1$ to $y_M$ of the arithmetic unit 1 with the threshold input from the threshold updating unit 7.

The learning state monitor 3 comprises a threshold controller 31 and a correlation matrix updating unit 32. The threshold controller 31 monitors the comparison results of the comparison circuits 6-1 to 6-M, determines the learning convergence state based on the comparison results, and instructs the threshold updating unit 7 to update the threshold. The correlation matrix updating unit 32 updates the correlation matrix W using the update value corresponding to the extent of learning saturation.

The operation of each unit in this embodiment will be described below in detail.

Figure 5A:
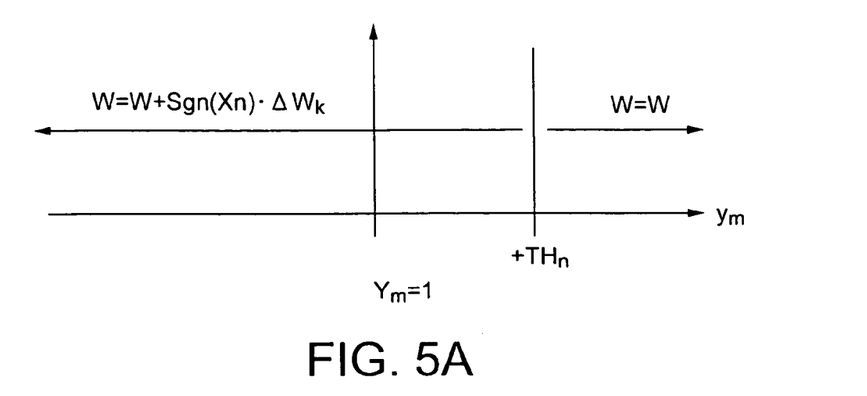
FIGS. 5A and 5B are diagrams showing a rule of learning a correlation matrix in a correlation matrix learning method according to the invention.
Figure 5B:
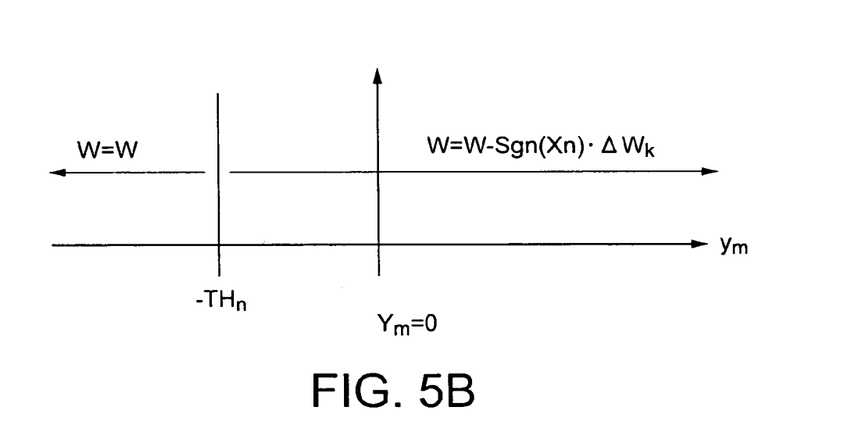
Figure 6:
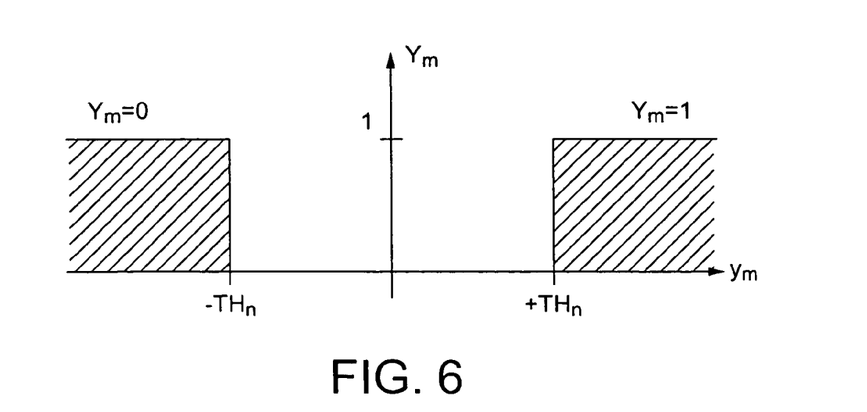
FIG. 6 is an explanatory diagram for illustrating an input range of calculation result y into a comparator when the correlation matrix is converged in the correlation matrix learning method according to the invention.
Figure 7:
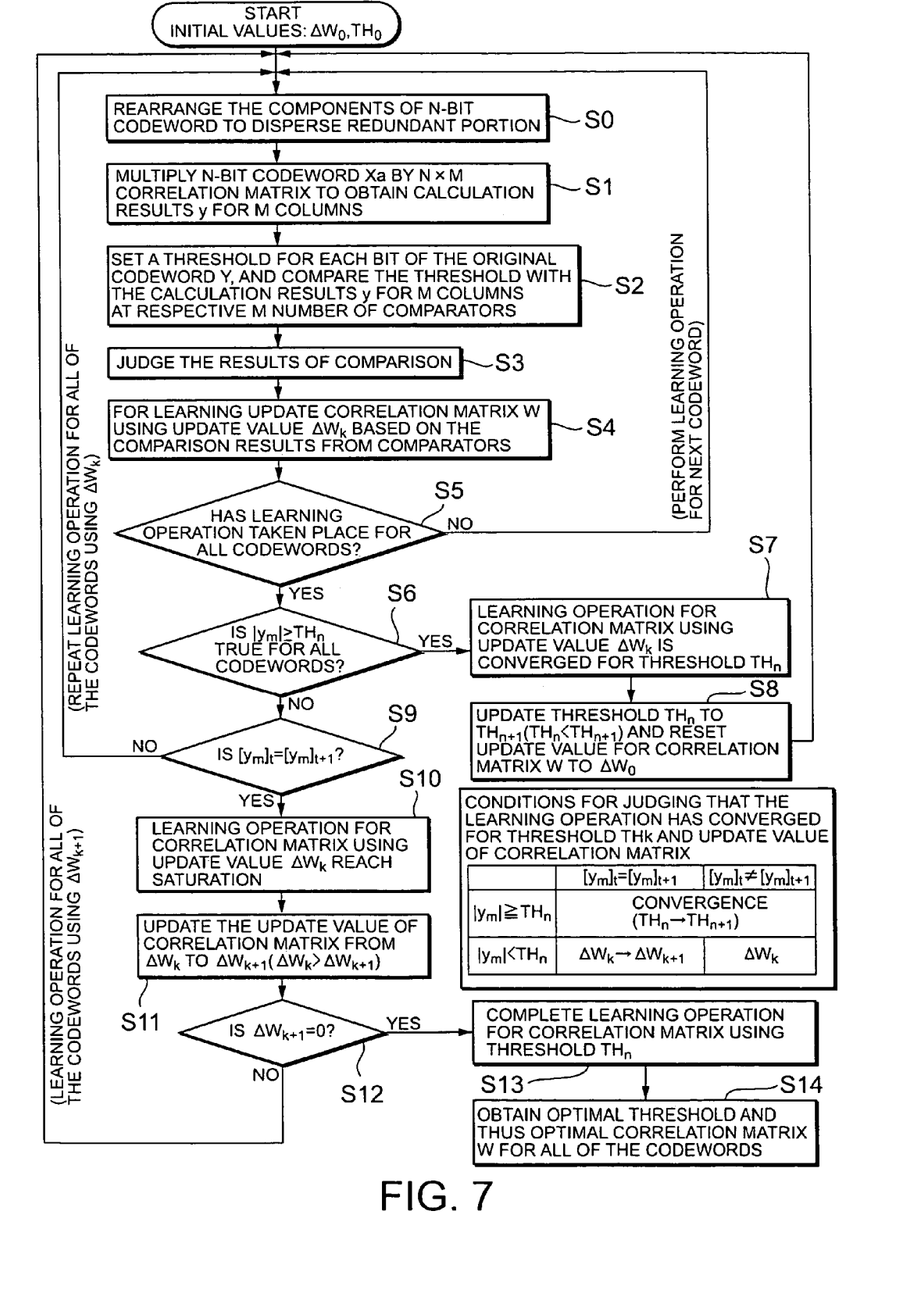
FIG. 7 is a flowchart illustrating the operation of the correlation matrix learning device according to the invention.

FIGS. 5A and 5B are explanatory diagrams showing a rule of learning the correlation matrix W. FIG. 6 is an explanatory diagram for illustrating an input range, $|y_m| \geq TH_n$ ($1 \leq m \leq M$), of calculation results $y_1$ to $y_M$ into the comparison unit 6 when the learning of the correlation matrix W is converged. FIG. 7 is a flowchart illustrating the operation of the correlation matrix learning device to which the correlation matrix learning method is applied.

The correlation matrix W is determined according to a predetermined rule of learning, from the calculation results $y_1$ to $y_M$ between the rearranged codeword Xa and the correlation matrix W, with the original codeword Y as a desired signal.

Hereinafter, the operation will be described with reference to the flowchart of FIG. 7.

First of all, a first original codeword Y of the codeword of learning object (decoding object) is input into the original codeword input unit 4.

Then, the encoder 5 performs block encoding on the first original codeword Y input into the original codeword input unit 4 at an encoding rate (N, M) and outputs the N-bit codeword X. This codeword X has the redundant portion of (N-M) bits added after the original codeword Y, as shown in FIG. 2A.

The rearrangement circuit 8 rearranges the components of the codeword X so that the redundant portion of the codeword X output from the encoder 5 may be evenly dispersed over multiple parts of the codeword, and outputs the codeword Xa after rearrangement, as shown in FIG. 2B (step S0).

It is not always required that the redundant portion is evenly dispersed over multiple parts of the codeword, but may be dispersed over multiple parts.

The codeword input unit 11 of the arithmetic unit 1 inputs the rearranged N-bit codeword Xa. The arithmetic unit 1 multiplies the codeword Xa held in the codeword input unit 11 by the N-row and M-column correlation matrix held in the correlation matrix holding unit 12, and outputs the calculation results $y_1$ to $y_M$ to the comparison unit 6 (step S1).

The comparison circuits 6-1 to 6-M of the comparison unit 6 compares the calculation results $y_1$ to $y_M$ output from the arithmetic unit 1 with the threshold output from the threshold updating unit 7 (step S2).

The threshold updating unit 7 sets threshold for the respective bits ($Y_1$ to $Y_M$) of the original codeword Y input from the original codeword input unit 4, based on the current learning convergence state to the comparison circuits 6-1 to 6-M. That is, the threshold updating unit 7 internally holds a plurality of thresholds "$+TH_0, +TH_1, \ldots, +TH_n, +TH_{n+1}, \ldots$" ($0=TH_0 \leq TH_1 \leq \ldots \leq TH_n \leq TH_{n+1} \leq \ldots$) and "$-TH_0, -TH_1, \ldots, -TH_n, -TH_{n+1}, \ldots$", and outputs the former thresholds when the value of bit is "1", or the latter thresholds when the value of bit is "0", based on the learning convergence state, and the original codeword Y.

For example, when the m-th bit $Y_m$ of the original codeword Y is "1", threshold "$+TH_0$" is output to comparison circuit 6-M, if the learning convergence state is the initial stage (first stage), or threshold "$+TH_1$" is output to comparison circuit 6-M, if the learning convergence state is the second stage.

Also, when the m-th bit $Y_m$ of the original codeword Y is "0", a threshold "$-TH_0$" is output to comparison circuit 6-M, if the learning convergence state is the first stage, or a threshold "$-TH_1$" is output to comparison circuit 6-M, if the learning convergence state is the second stage.

Thereafter, the correlation matrix updating unit 32 of the learning state monitor 3 updates the correlation matrix W held in the correlation matrix holding unit 12, based on the comparison results of the comparison circuits 6-1 to 6-M, the update value $\Delta W_k$ at the present time, the codeword Xa after rearrangement, the original codeword Y, and the rules as shown in FIGS. 5A and 5B (steps S3 and S4).

Herein, the rules as shown in FIGS. 5A and 5B areas follows.

FIG. 5A shows a rule when the m-th bit $Y_m$ of the original codeword Y is "1". That is, when the output of comparison circuit 6-M indicates $Y_m \geq TH_n$, the correlation matrix W is not updated. On the contrary, when the output of comparison circuit 6-M indicates $y_m < TH_n$, the components (first to N-th rows) at the m-th column of the correlation matrix W are updated by the update value $\Delta W_k$ at the present time in accordance with the values of the first to N-th bits of the codeword Xa.

Also, FIG. 5B shows a rule when the m-th bit $Y_m$ of the original codeword Y is "0". That is, when the output of comparison circuit 6-M indicates $y_m \leq -TH_n$, the correlation matrix W is not updated. On the contrary, when the output of comparison circuit 6-M indicates $y_m > -TH_n$, the components (first to N-th rows) at the m-th column of the correlation matrix W are updated by the update value $\Delta W_k$ at the present time in accordance with the values of the first to N-th bits of the codeword Xa.

Specifically, when the m-th bit $Y_m$ of the original codeword Y is "1", the threshold "$+TH_n$" is set to the comparison circuit 6-M. When the input $y_m$ into the comparison circuit 6-M is greater than or equal to "$+TH_n$", the correlation matrix W is not updated.

However, when the input $y_m$ into the comparison circuit 6-M is less than "$+TH_n$", the components $W_{1,m}$ to $W_{N,m}$ at the m-th column of the correlation matrix W are updated as follows.

$$W_{N,m} = W_{N,m} + \text{Sgn}(X_N) \cdot \Delta W_k$$

$$W_{N-1,m} = W_{N-1,m} + \text{Sgn}(X_{N-1}) \cdot \Delta W_k$$

$$W_{1,m} = W_{1,m} + \text{Sgn}(X_1) \cdot \Delta W_k$$

On the other hand, when the m-th bit $Y_m$ of the original codeword Y is "0", the threshold "$-TH_n$" is set to the comparison circuit 6-M. When the input $y_m$ into the comparison circuit 6-M is less than or equal to "$-TH_n$", the correlation matrix W is not updated.

However, when the input $y_m$ into the comparison circuit 6-M is greater than "$-TH_n$", the components $W_{1,m}$ to $W_{N,m}$ at the m-th column of the correlation matrix W are updated as follows.

$$W_{N,m} = W_{N,m} - \text{Sgn}(X_N) \cdot \Delta W_k$$

$$W_{N-1,m} = W_{N-1,m} - \text{Sgn}(X_{N-1}) \cdot \Delta W_k$$

$$W_{1,m} = W_{1,m} - \text{Sgn}(X_1) \cdot \Delta W_k$$

Herein, when the components $[X_N, X_{N-1}, X_{N-2}, \ldots, X_2, X_1]$ of the block encoded codeword are represented in binary values, "1" and "0", "0" is regarded as "-1" in calculation. In the above equations, $\text{Sgn}(X_n)$ represents the sign ± of "$X_n$".

The threshold controller 31 of the learning state monitor 3 determines whether or not the learning with threshold "$TH_n$" and update value "$\Delta W_k$" is performed for all of the codewords of learning object, if the processing at step S4 is ended (step S5). That is, it is judged whether or not the learning process is ended once. And when there is any codeword that is not learned (NO at step S5), the processings from step S0 to step S4 are performed again for the next codeword. On the contrary, when it is determined that all of the codewords are learned (YES at step S5), it is judged whether or not the calculation results of the arithmetic unit 1 for all of the codewords satisfy the condition $|y_m| \geq TH_n$ as shown in FIG. 6, based on the comparison results for the codewords sent from the comparison unit 6 (step S6). That is, it is determined whether or not the correlation matrix W held in the correlation matrix holding unit 12 is updated in the learning process at the present time.

And when it is judged that the calculation results of the arithmetic unit 1 for all of the codewords satisfy the condition of FIG. 6 (YES at step S6), it is judged that the learning state at threshold "$TH_n$" is converged (step S7), and the threshold updating unit 7 is instructed to update the threshold from "$\pm TH_n$" to "$\pm TH_{n+1}$". Also, the correlation matrix updating unit 32 is instructed to set the update value of the correlation matrix W to the initial value "$W_0$" (step S8). Thereafter, the procedure returns to step S0 to repeat the learning for all of the codewords.

On the other hand, if it is judged that there is any codeword not satisfying the condition of FIG. 6 in the calculation results of the arithmetic unit 1 (NO at step S6), it is judged whether or not the calculation result $[y_m]_{t+1}$ for all of the codewords at the present time of learning and the calculation result $[y_m]_t$ for all of the codewords at the previous time of learning are identical (step S9).

And if the calculation results for all of the codewords at the present time of learning are identical to those at the previous time of learning, namely, $[y_m]_{t+1}=[y_m]_t$ (YES at step S9), it is determined that the learning operation for the correlation matrix W at threshold "$TH_n$" using the update value "$\Delta W_k$" reaches saturation (step S10). At this time, the correlation matrix updating unit 32 is instructed to change the update value of the correlation matrix W from "$\Delta W_k$" to "$\Delta W_{k+1}$" (step S11). If "$\Delta W_{k+1}$" is not zero (NO at step S12), the procedure returns to step S0 to repeat the processings following step S0 with the new update value $\Delta W_{k+1}$. On the other hand, if "$\Delta W_{k+1}$" is zero (YES at step S12), the learning operation for the correlation matrix W at threshold "$TH_n$" is ended (steps S13 and S14). Also, if it is judged that $[y_m]_{t+1}$ is not equal to $[y_m]_t$ at step S9, the procedure returns to step S0 to repeat the learning operation for all of the codewords with the update value "$\Delta W_k$".

If the learning operation for the correlation matrix W is performed in accordance with the above rule of learning, the optimal threshold "$TH_n$" is obtained for all of the codewords Xa after rearrangement.

With the above explanation, in the correlation matrix learning method of the invention, if the learning state of the correlation matrix is converged (in which the correlation matrix is not updated), the threshold is increased to make the learning operation again, whereby the correlation matrix is generated using the optimal threshold. Furthermore, every time the learning state reaches saturation, the update value for the correlation matrix is decreased, and when the update value is "0", the learning operation is ended. Hence, it is unnecessary to perform the learning operation more than required, so that the learning operation for the correlation matrix is made faster.

The processings with the flowchart as shown in FIG. 7 are implemented with their functions by storing the correlation matrix learning program in a recording medium such as a flexible disk, a CD-ROM, an optical magnetic disk, RAM, or ROM, loading it into the computer via a drive unit for the storage medium, and executing it.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A communication system which operates using a correlation matrix, said communication system comprising:
   a transmitting apparatus, said transmitting apparatus comprising:
      an encoder which performs block encoding on an original code-word at an encoding rate to generate a codeword with a redundant portion;
      a rearrangement circuit which rearranges the components of said codeword with a redundant portion so that the redundant portion is dispersed over multiple parts of the codeword with a redundant portion based on a rearrangement rule;
      a sending unit for sending the rearranged codeword; and
   a receiving apparatus, said receiving apparatus comprising:
      a receiving unit which receives the rearranged codeword transmitted from said sending unit; and
      an arithmetic unit which performs a calculation based on the rearranged codeword received by said receiving unit and the correlation matrix having rows rearranged according to the rearrangement rule, in order to decode the original codeword from the received rearranged codeword.

2. A method for generating a correlation matrix for use in decoding an original codeword from a rearranged codeword, the method comprising:
   generating said rearranged codeword by dispersing over multiple parts of said original codeword a redundant portion added to said original codeword;
   transmitting said rearranged codeword to a receiving apparatus;
   performing a calculation based on said rearranged codeword and said correlation matrix; and
   updating said correlation matrix based on a comparison of a calculation result and a threshold corresponding to the original codeword.

3. A correlation matrix learning method for generating a correlation matrix for use in decoding an original codeword from a codeword having a redundant portion, the method comprising:
   rearranging components of the codeword having a redundant portion so that the redundant portion is dispersed over multiple parts of the rearranged codeword;
   transmitting said rearranged codeword to a receiving apparatus;
   performing a calculation based on the rearranged codeword and said correlation matrix;
   comparing components of the calculation results with a threshold corresponding to the original codeword;
   judging the comparison results; and
   performing a learning process to update the values of the components of said correlation matrix by an update value based on the comparison results, wherein said performing a learning process is followed by said rearranging.

4. The correlation matrix learning method according to claim 3, wherein when completing the learning process, determining whether said correlation matrix is updated in the learning process, and if not updated, increasing an absolute value of said threshold.

5. The correlation matrix learning method according to claim 4, wherein an initial value of said threshold is zero.

6. The correlation matrix learning method according to claim 3, wherein when completing the learning process, determining whether a learning state reaches saturation, and if the learning state reaches saturation, decreasing said update value, and ending the learning process if the decreased update value is zero.

7. A correlation matrix learning device for generating a correlation matrix for use in decoding an original codeword from a rearranged codeword, the device comprising:
- a rearranging unit which rearranges said original codeword such that a redundant portion added to said original codeword is dispersed over multiple parts of said rearranged codeword;
- an arithmetic unit which performs a predetermined calculation using said codeword and said correlation matrix and updates said correlation matrix based on a comparison of the calculation results with a threshold corresponding to said original codeword; and
- a transmitter which transmits said correlation matrix.

8. A correlation matrix learning device which generates a correlation matrix for use in decoding an original codeword from a rearranged codeword having a redundant portion, comprising:
- a rearrangement circuit which rearranges the components of the rearranged codeword based on a rule of rearrangement so that the redundant portion added to said codeword may be dispersed over multiple parts of the rearranged codeword;
- an arithmetic unit which performs a predetermined calculation based on said rearranged codeword and said correlation matrix;
- a comparison unit which compares components of the calculation results with a threshold corresponding to said original codeword;
- a learning state monitor for updating the values of the respective components of said correlation matrix by an update value based on the comparison results, wherein if all of the codewords of a learning object are input into said rearrangement circuit, a first codeword input into the rearrangement circuit is input again into said rearrangement circuit, or if there is an uninput codeword, then a next codeword of the learning object is input into said rearrangement circuit; and
- a transmitter which transmits said correlation matrix.

9. The correlation matrix learning device according to claim 7 or 8, wherein said correlation matrix has the rows rearranged based on the rule of rearrangement.

10. The correlation matrix learning device according to claim 8, wherein said learning state monitor determines whether said correlation matrix is updated, each time a codeword is input into said rearrangement circuit, and increases an absolute value of said threshold if the correlation matrix is not updated.

11. The correlation matrix learning device according to claim 10, wherein an initial value of said threshold is zero.

12. The correlation matrix learning device according to claim 7, wherein said learning state monitor determines whether said learning state reaches saturation each time a codeword is input into said rearrangement circuit, and decreases an update value if the learning state reaches a saturation, and ends the learning process if the decreased update value is zero.

13. A computer program product for enabling a computer to implement a correlation matrix learning device for generating a correlation matrix for use in decoding an original codeword from a codeword having a redundant portion, said computer program product comprising:
- a computer readable medium; and
- software instructions on the computer readable medium adapted to enable the computer to perform operations of:
  - rearranging components of the codeword having a redundant portion so that the redundant portion is dispersed over multiple parts of the codeword having a redundant portion based on a rearrangement rule;
  - performing a calculation based on the rearranged codeword and said correlation matrix;
  - comparing a component of the calculation result with a threshold corresponding to the original codeword;
  - updating a value of a component of said correlation matrix by an update value, based on the comparison result; and
  - rearranging again a first codeword previously rearranged if all of the codewords have been rearranged, or rearrange a next codeword if there is an uninput codeword.

14. A method for generating a correlation matrix for use in decoding an original codeword from a rearranged codeword, the method comprising:
- generating said rearranged codeword by dispersing over multiple parts of said original codeword a redundant portion added to said original codeword;
- performing a calculation based on said rearranged codeword and said correlation matrix;
- updating said correlation matrix based on a comparison of a calculation result and a threshold corresponding to the original codeword; and
- transmitting said correlation matrix to a receiving apparatus for decoding an original codeword.

15. A correlation matrix learning method for generating a correlation matrix for use in decoding an original codeword from a codeword having a redundant portion, the method comprising:
- rearranging components of the codeword having a redundant portion so that the redundant portion is dispersed over multiple parts of the rearranged codeword;
- performing a calculation based on the rearranged codeword and said correlation matrix;
- comparing components of the calculation results with a threshold corresponding to the original codeword;
- judging the comparison results;
- performing a learning process to update the values of the components of said correlation matrix by an update value based on the comparison results, wherein said performing a learning process is followed by said rearranging; and
- transmitting said correlation matrix to a receiving apparatus for decoding an original codeword.

* * * * *